US008917524B2

(12) United States Patent
Catalano

(10) Patent No.: US 8,917,524 B2
(45) Date of Patent: Dec. 23, 2014

(54) MULTI-FUNCTION INDUCTOR AND MANUFACTURE THEREOF

(75) Inventor: Robert Catalano, Mesquite, TX (US)

(73) Assignee: General Electric Company, Schenectady, NY (US)

( * ) Notice: Subject to any disclaimer, the term of this patent is extended or adjusted under 35 U.S.C. 154(b) by 217 days.

(21) Appl. No.: 13/366,598

(22) Filed: Feb. 6, 2012

(65) Prior Publication Data

US 2013/0201645 A1 Aug. 8, 2013

(51) Int. Cl.
*H05K 7/02* (2006.01)
*H05K 7/04* (2006.01)

(52) U.S. Cl.
USPC ............................ 361/807; 336/192; 336/200

(58) Field of Classification Search
USPC ............ 361/807; 336/83, 178, 192, 199, 200, 336/221-223
See application file for complete search history.

(56) References Cited

U.S. PATENT DOCUMENTS

| | | | | |
|---|---|---|---|---|
| 3,838,316 | A | 9/1974 | Brown et al. | |
| 4,583,068 | A * | 4/1986 | Dickens et al. | 336/82 |
| 4,658,091 | A | 4/1987 | McCarthy et al. | |
| 5,724,016 | A * | 3/1998 | Roessler et al. | 336/65 |
| 6,140,899 | A * | 10/2000 | Kayser et al. | 335/220 |
| 6,212,086 | B1 * | 4/2001 | Dinh | 363/144 |
| 6,420,953 | B1 * | 7/2002 | Dadafshar | 336/200 |
| 6,774,755 | B2 * | 8/2004 | Nakata et al. | 336/83 |
| 7,352,269 | B2 * | 4/2008 | Li et al. | 336/170 |

* cited by examiner

*Primary Examiner* — Hung S Bui
(74) *Attorney, Agent, or Firm* — Global Patent Operation; Stephen G. Midgley

(57) ABSTRACT

An inductor assembly comprising a first magnetic core and an electrically conductive material configured to wind around at least a portion of the first magnetic core. The electrical conductive material has one or more support structures that extend beyond an outside boundary of the first magnetic core.

17 Claims, 4 Drawing Sheets

MULTI-FUNCTION INDUCTOR AND MANUFACTURE THEREOF

TECHNICAL FIELD

This application is directed, in general, to inductors and their method of manufacture.

BACKGROUND

This section introduces aspects that may be helpful to facilitating a better understanding of the inventions. Accordingly, the statements of this section are to be read in this light. The statements of this section are not to be understood as admissions about what is in the prior art or what is not in the prior art.

As electrical circuits, such as power modules, are reduced in size, power management and packaging to thermally manage of the module becomes an increasingly difficult task. Although heat sinks can facilitate the removal of heat, space limitations make their use increasingly impractical. Consequently, the ability to remove heat from electrical components can present a circuit design limitation.

SUMMARY

One embodiment of the disclosure is an inductor assembly. The inductor assembly comprises a magnetic core and an electrically conductive material configured to wind around at least a portion of the magnetic core. The electrical conductive material has one or more support structures that extend beyond an outside boundary of the magnetic core.

Another embodiment is an electrical circuit. The electrical circuit comprises a circuit board having electrical components thereon and one or more inductor assemblies located on the circuit board and adjacent to at least one of the electrical components. Each of the inductor assemblies includes the above-described inductor assembly.

Another embodiment provides a method of manufacturing an inductor assembly. The method comprises providing a magnetic core and forming an electrically conductive material which winds around at least a portion of the magnetic core, wherein the electrical conductive material has one or more support structures that extend beyond an outside boundary of the magnetic core.

BRIEF DESCRIPTION

Figure 1:
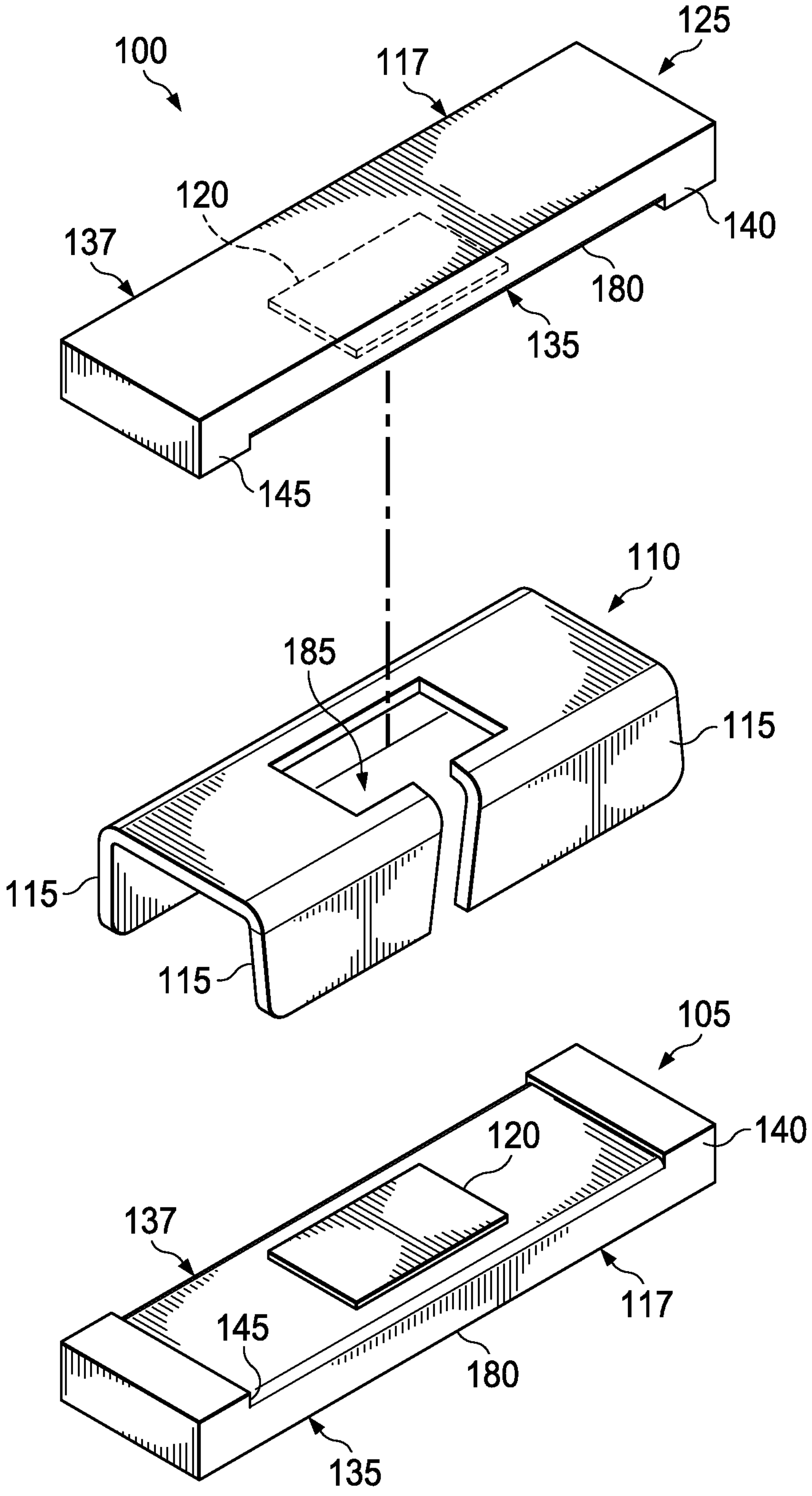
Figure 1A:
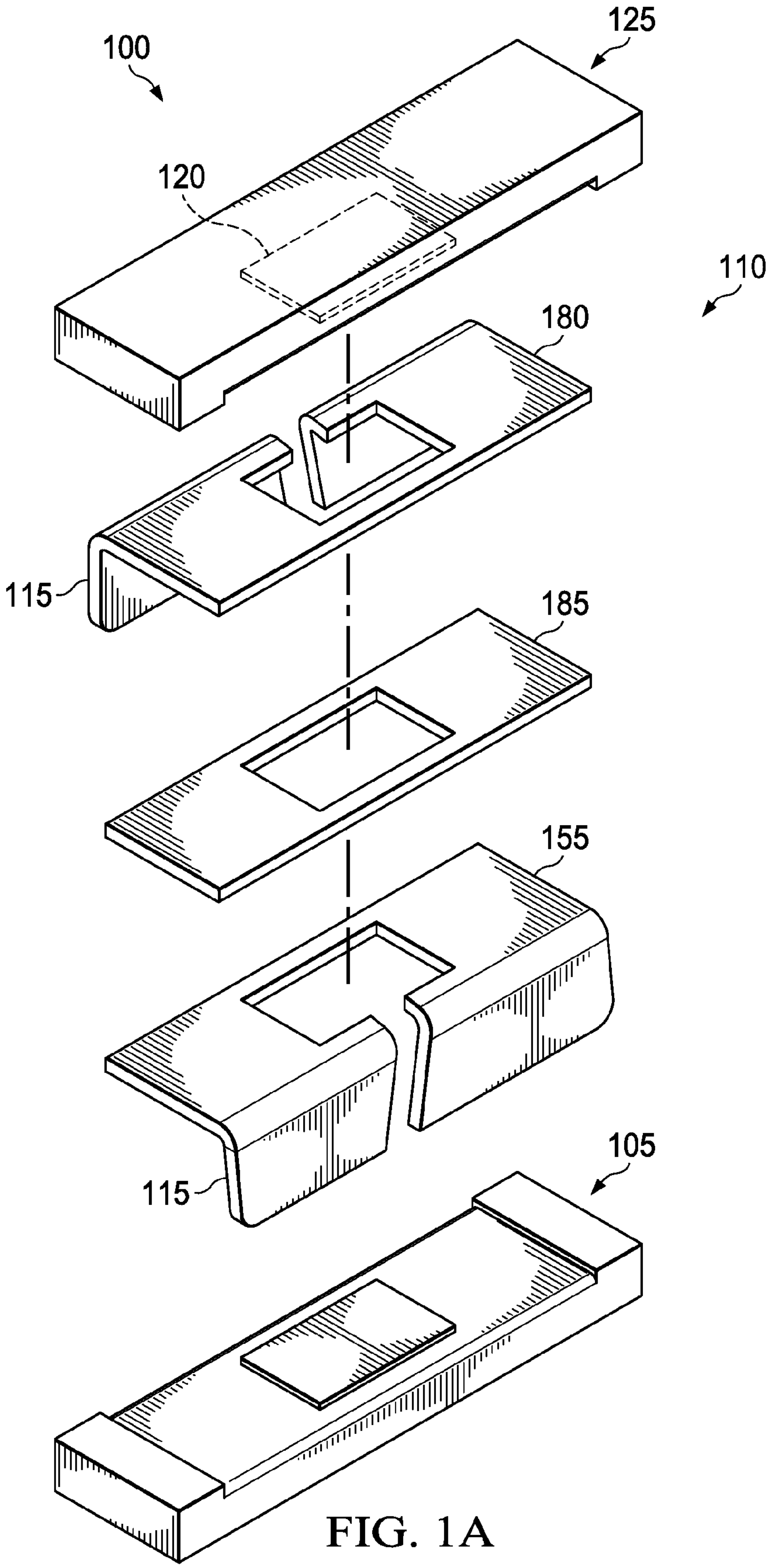
Figure 2:
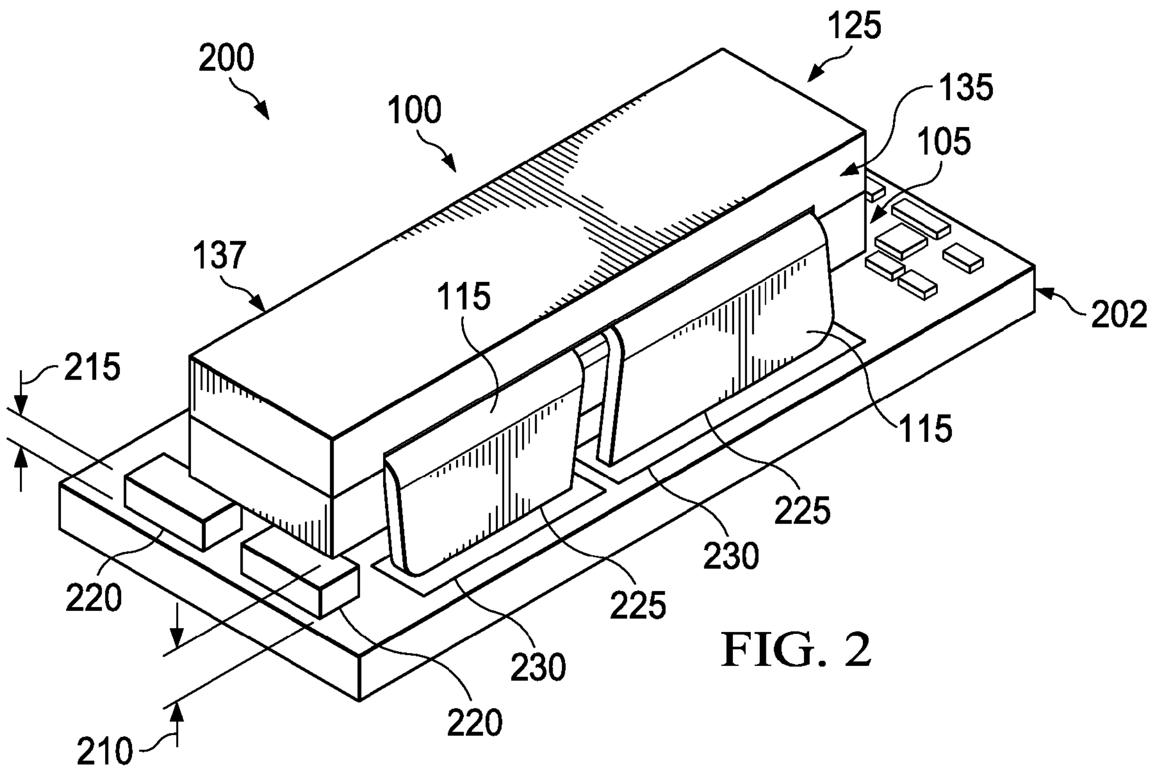
Figure 3:
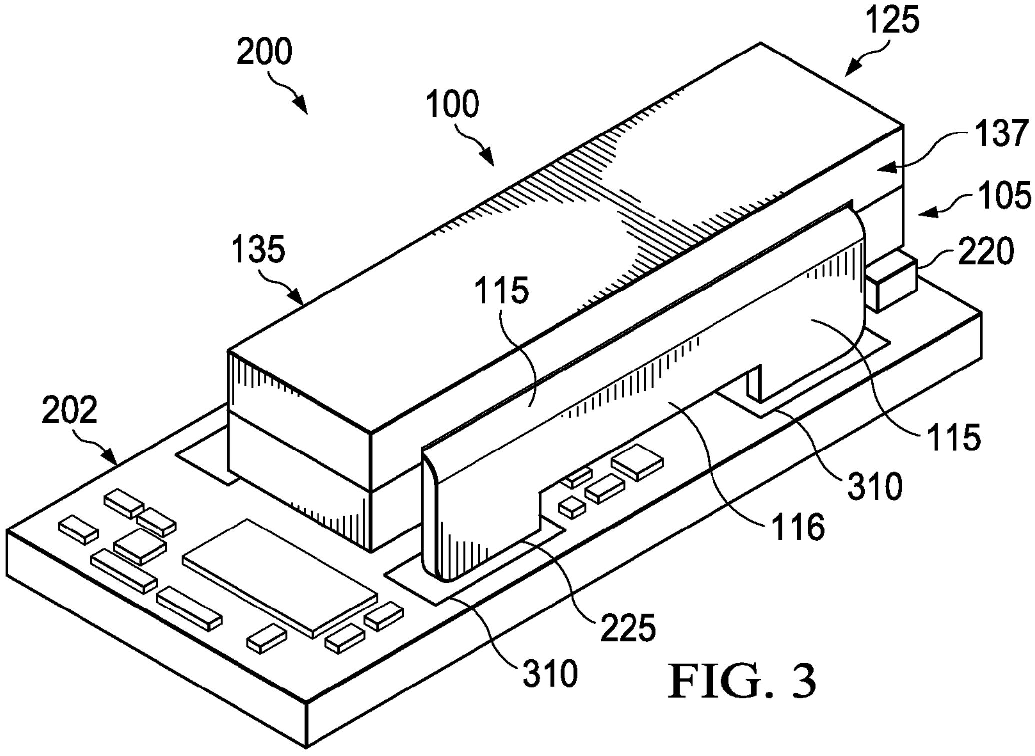
Figure 4:
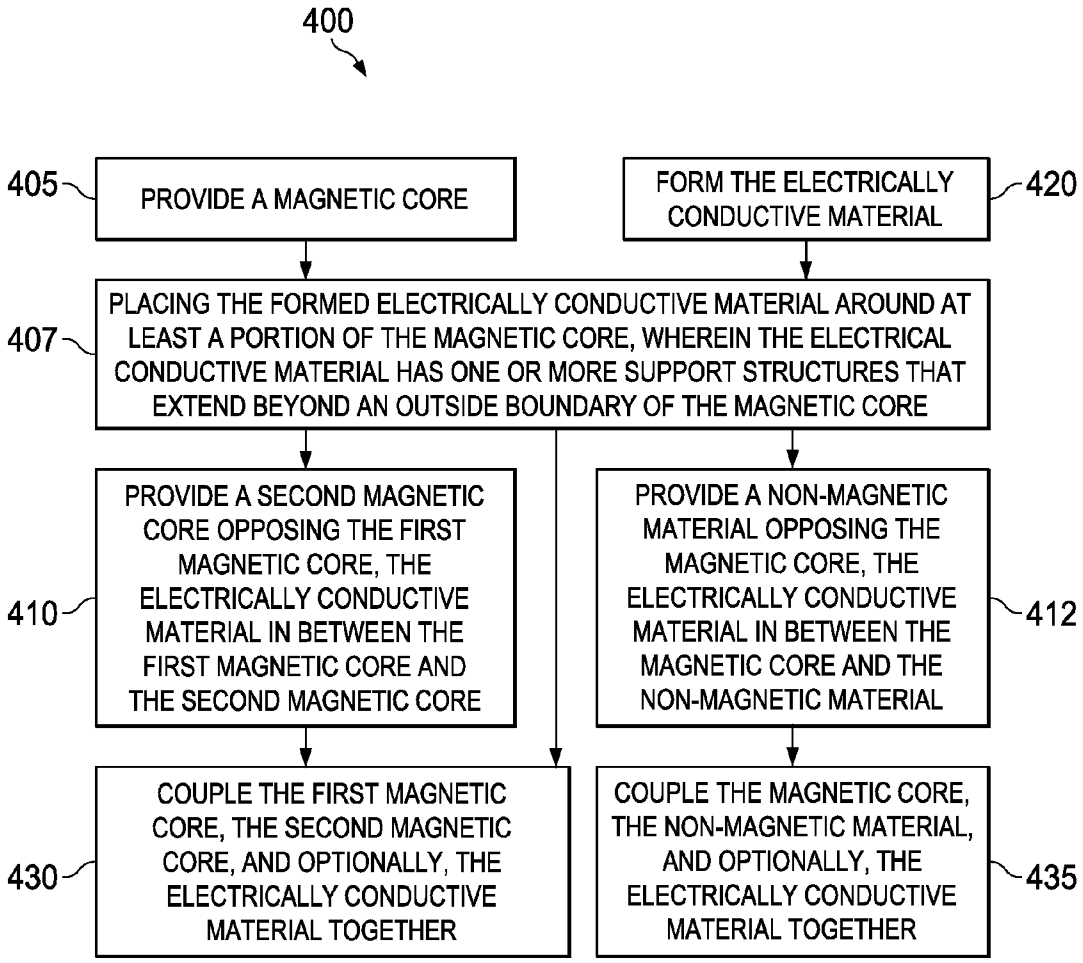

Embodiments of the disclosure are better understood from the following detailed description, when read with the accompanying FIGUREs. Corresponding or like numbers or characters indicate corresponding or like structures. Various features may not be drawn to scale and may be arbitrarily increased or reduced in size for clarity of discussion. Reference is now made to the following descriptions taken in conjunction with the accompanying drawings, in which:

FIG. 1 presents an exploded perspective view of an example embodiment of an inductor assembly of the disclosure;

FIG. 1A presents an exploded perspective view of another example embodiment of an inductor assembly of the disclosure;

FIG. 2 presents a perspective view of the example embodiment of the inductor assembly presented in FIG. 1, in an assembled configuration, as part of an example electrical circuit of the disclosure after mounting on an circuit board of the circuit;

FIG. 3 presents a perspective view of the opposite side of the example embodiment of the inductor assembly presented in FIG. 2, in an assembled configuration and after mounting to the circuit board of the electrical circuit; and FIG. 4 presents a flow diagram of an example embodiment of a method of manufacturing an inductor assembly of the disclosure, such as any of the inductor assemblies depicted in FIGS. 1-3.

DETAILED DESCRIPTION

The following merely illustrate principles of the invention. Those skilled in the art will appreciate the ability to devise various arrangements which, although not explicitly described or shown herein, embody the principles of the invention and are included within its scope. Furthermore, all examples and conditional language recited herein are principally intended expressly to be only for pedagogical purposes to aid in understanding the principles of the invention and the concepts contributed by the inventor(s) to furthering the art, and are to be construed as being without limitation to specifically disclosed embodiments and conditions. Moreover, all statements herein reciting principles, aspects, and embodiments of the invention, as well as specific examples thereof, are intended to encompass equivalents thereof. Additionally, the term, "or," as used herein, refers to a non-exclusive or, unless otherwise indicated. Also, the various embodiments described herein are not necessarily mutually exclusive, as some embodiments can be combined with one or more other embodiments to form new embodiments.

It would be beneficial to have a multi-functional inductor that can serve as an inductor for an electrical circuit and also serve as a heat removal device. Certain embodiments of such multi-functional inductor, as disclosed herein, are configured to use an electrically conductive material that can both carry an electrical current and also sink the heat out of electrical components proximate to the inductor. Support structures of the electrically conductive material facilitate such heat removal. Additionally, the support structures provide mechanical support for the inductor allowing it to be raised off of the circuit board such that electrical components may be placed underneath the inductor without the addition of separate mounting hardware.

One embodiment of the disclosure is an inductor assembly. FIG. 1 presents an exploded perspective view of an example embodiment of an inductor assembly 100 of the disclosure. FIG. 2 presents a perspective view of the example embodiment of the inductor assembly 100 presented in FIG. 1, in an assembled configuration, as part of an example electrical circuit 200 after mounting on an circuit board 202 (e.g., a printed wiring board) of the circuit 200. FIG. 3 presents a perspective view of the opposite side of the example embodiment of the inductor assembly 100 presented in FIG. 2, in an assembled configuration and after mounting to the circuit board 202 of the electrical circuit 200.

The inductor assembly 100 comprises a magnetic core 105. The assembly 100 also comprises an electrically conductive material 110 configured to wind around at least a portion of the magnetic core 105. The inductor assembly 100 as illustrated in FIG. 1 has a single turn winding of the electrically conductive material 110. In other embodiments, the electrically conductive material 110 may also be configured or formed to have a multi-turn winding or multiple windings of the electrically conductive material 110. The electrical conductive material 110 has one or more support structures 115 that extend beyond an outside boundary 117 of the magnetic core 105 or (e.g., the boundary 117 of the magnetic core 105 as depicted in FIG. 1).

As illustrated in FIG. 1, in some cases, a portion of the conductive material 110 is wound around a central portion 120 of the magnetic core 105. In other cases, however, to facilitate heat transfer, the conductive material 110 could be additionally, or alternatively, formed to be wound around other portions of the magnetic core 105, such as external portions of the core such as, for example, the outer legs 140 or 145.

As further illustrated in FIG. 1, in some embodiments the assembly 100 further includes a second magnetic core 125 opposing the first magnetic core 105. The electrically conductive material 110 can be located in between the space or cavity created by the legs 120, 140, and 145 of the first magnetic core 105 and the second magnetic core 125. In some embodiments, the electrically conductive material is configured to wind around at least a portion of the second magnetic core 125 (e.g., a central portion 120 of the second magnetic core 125 as depicted in FIG. 1).

In some embodiments of the assembly 100, the first magnetic core 105 (or the second magnetic core 125, when present) can include, or be, ferrite cores, although other magnetic material could be used if, desired. In some cases, the first magnetic core 105 and the electrically conductive material 110 could be coupled to non-magnetic material (e.g., a non-magnetic material substantially in the same location and opposed the first magnetic core as the second core 125 depicted in FIGS. 1-3). In some embodiments, the electrically conductive material 110 can include, or be, a copper layer stamped or bent into the appropriate shape, although other electrically conductive material could be used, if desired. In some embodiments, the electrically conductive material 110 is configured as a single turn of a heavy copper layer (e.g., having a thickness of about 0.0042 inches but other thickness are possible in other embodiments). In other embodiments, however, electrically conductive material 110 can be configured to have multiple turns and thereby be wound a plurality of times around the portion of the first or second magnetic cores 105, 125 (e.g., central portion 120).

As noted above, some embodiments of the electrically conductive material 110 can be configured or formed to have multiple windings. FIG. 1A presents an exploded perspective view of example embodiment of an inductor assembly of the disclosure with such a configuration. As illustrated, in some embodiments, the electrically conductive material 110 can include two separate electrically conductive windings 150, 155, the windings 150, 155 separated by an insulating layer 160. Each of the windings 150, 155 are configured to wind around at least a portion of the magnetic core 105. Providing an assembly 100 whose electrically conductive material 110 includes two or more such windings 150, 155 can advantageously expand the range of application of the assembly 100. For instance, as illustrated in FIG. 1A, in some cases the windings 150, 155 can each include two support structures 115. Depending upon how these two-pairs of support structures 115 are connected as electrical leads to an electrical circuit, the assembly 100 can be configured as a common-mode inductor or as a two-phase point-of-load inductor. Based on the disclosure, one of ordinary skill would understand how the electrically conductive material 110 could include a variety of different numbers and shapes of windings 150, 155 and insulator 160 (or insulators) there-between. For instance, in still other embodiments, the windings 150, 155 could include different numbers of the support structures 115, or, one winding could have all of the support structures 115 and the other winding could have none of the support structures 115.

As illustrated in FIGS. 2 and 3, in some embodiments of the assembly 100, to facilitate a stable mount to the circuit board 202, the electrically conductive material 110 has four of the support structures 115, each of the support structures extending equal distances 210 beyond the outside boundary of the magnetic core 105 (e.g., the first magnetic core 105 being closest to the circuit board 202 when there is also a second core 125).

For instance, as shown in FIG. 2, in some cases, the one or more support structures 115 extend beyond the outside boundary of the magnetic core 105 by a distance 210 greater than a height 215 of electrical components 220 configured to be located on the circuit board 202 and at least partly directly below the inductor assembly 100. Electrical components may also be located completely under the inductor assembly 100. Configuring the support structures 115 such that electrical components 220 can be so placed underneath the assembly 100 facilitates the efficient use of space on the circuit board 202, thereby promoting miniaturization of the circuit 200. As illustrated in FIG. 1 the supporting structures 115 may be formed at approximately 90 degrees from the body of the electrical conducting material 110. Other angles may be used but the width of the inductor assembly will increase thus reducing its space effectiveness.

The disclosed inductor assembly 100 is in contrast to an inductor whose magnetic core is configured to be either mounted directly to, or through, the circuit board 202, leaving no space for components 220 to be placed underneath, or, mounted off the circuit board 202 using a secondary device such as a terminal header or carrier. However, such header or carrier structures may not act as efficient thermally conductors because there is typically no mechanism for these structures to conduct heat outward from the circuit board 202 or from the components 220 on the circuit board 202. The disclosed inductor assembly 100 is also in contrast to the coupling of heat sinks (e.g., heat pipes or fins) to one of the magnetic cores. While such structures can facilitate the removal of heat from the inductor 100 itself, they may do little to remove heat from the circuit board 202 or from the components 220 on the circuit board 202.

As illustrated in FIGS. 2 and 3, in some embodiments of the assembly 100, two of the support structures 115 are separated from, and adjacent to, one side 135 of the magnetic core 105 and another two of the support structures 115 are separated from and adjacent to an opposite side 137 of the magnetic core 105. In some embodiments of the assembly 100, terminal ends 225 of the one or more support structures 115 are configured to contact a corresponding one or more landing pads 230, 310 located on a circuit board 202. For instance as depicted in FIGS. 2 and 3, in some cases, each one of the support structures 115 contacts a different one of the landing pads 230, 310.

As illustrated in FIG. 1, in some embodiments, the first magnetic core 105 (and the second magnetic core 125 when present) can each be configured as an E-shaped structure. For instance, in embodiments having first and second magnetic cores 105, 125 that are both E-shaped, each of the cores 105, 125 has three separate legs 120, 140, 145 joined to a base 180. As depicted in FIG. 1, the second magnetic core 125 can be arranged to oppose the first magnetic core 105 such that each of the legs 120, 140, 145 of the first magnetic core 105 contact a different one of the legs 120, 140, 145 of the second magnetic core 125. In some embodiments one or two of the legs of magnetic core 105 or 125 or both 105 and 125 may be shorter than the remaining leg or legs. This enables a gap to exist between the shortened leg or legs when cores 105 and 125 are coupled. Said gap or gaps are sometimes employed in a magnetic structure to provide advantageous inductance characteristics for the inductor. In some embodiments all the legs 120, 140, and 145 may be the same length and a gap is formed on all three legs during assembly by the use of a spacer on each of said legs. Usually it is advantageous to have a single gap in the center leg 120 since a spacer is not required to obtain the desired gap size thus simplifying assembly. It also confines the fringing magnetic flux present in the gap to the center of the magnetic structure. As also illustrated, in some embodiments, the electrically conductive material 110 is configured to wind around the portion that corresponds to one or both of the centrally located legs 120 of the first magnetic core 105 or the second magnetic core 125.

One of ordinary skill would appreciate that the magnetic core 105 (or cores 105, 125) could be configured to have many different shapes. For instance, without limitation, the first or second cores 105, 125 could be each configured to have an ER, PQ, UU, Toroid, EP, EPC, HI, or EQ shapes. Based on the present disclosure, one skilled in the art would understand how to suitably configure the shape of the electrically conductive material 110 to wind around a portion of the magnetic cores 105, 125 having such shapes and still provide the desired magnetic properties and one or more support structures 115 extending beyond the outside boundary 117 of at least one of the magnetic cores 105, 125.

FIGS. 2 and 3 illustrate another embodiment of the disclosure, an electrical circuit 200. The electrical circuit 200 comprises a circuit board 202 having electrical components 220 thereon. Some or all of the components 220 may be passive or active components that can act as a heat source. The circuit 200 also comprises one or more inductor assemblies 100 located on the circuit board and adjacent to (including on top of) at least one of the electrical components 220. Embodiments of the circuit 200 include, but are not limited to, DC-DC point-of-load converter modules, filter modules, power supplies and other types of circuits requiring at least one inductor familiar to those skilled in the art. Each inductor assembly 100 can include, or be, any of the embodiments of the inductor assemblies, with the magnetic core 105 and the electrically conductive material 110, or second magnetic core 125, when present, arranged as discussed above in the context of FIGS. 1-3. In the example embodiments, depicted in FIGS. 1-3 there are four support structures 115 in some case, some or all of the support structures 115 can also serve as heat sinks and in some cases at least some of the support structures 115 can additionally, or alternatively, serve as electrical leads.

For instance, in some cases, the one or more support structures 115 of the electrically conductive material 110 extend beyond the outside boundary 117 of the magnetic core 105 by a distance 210 greater than a height 215 of the electrical components 220 located at least partly directly below or completely underneath the inductor assembly 100.

For instance, terminal ends 225 of the one or more support structures 115 can be configured to contact a corresponding one or more landing pads 230, 310 located on the circuit board 202. The terminal ends 225 of the one or more support structures 115 can be solder bonded using, for example a solder reflow process, to the corresponding one or more of the particular landing pad 230, 310 that it contacts. Heat from components situated underneath the inductor assembly 100 may be transferred to the bottom surface 117 of the core 105 either through radiation or convection. The thermal communication between said components and the inductor assembly may be improved by placing a thermally conductive material such as Tputty™ (Laird Technologies, Inc., Chesterfield, Mo.) or other materials familiar to those skilled in the art in the space between said components and the bottom surface 117 of core 105.

For instance, in some embodiments, at least one of landing pads (e.g., one or both of pads 310 shown in FIG. 3) may be electrically or thermally connected to heat generating electrical components 220 on the circuit board 202. The heat generating electrical components 220 can be any active (e.g., integrated circuit) or passive (e.g., resistor) components that can provide a relative hot-spot on the circuit board 202 when the circuit 200 is in operation. In some cases, to facilitate conductive heat transfer, one or more heat conductive structures (e.g., metal strips or lines) on the circuit board form a heat dissipation pathway from at least one of the electrical components 220 to the landing pad 330 that the support structure 115 contacts. However, in other cases electrical components underneath or proximate to one of the inductor assemblies 100 on the circuit board 202 can radiate heat, via convective heat transfer, into the one or both of the magnetic cores 105, 125, which, in turn, is in direct contact with the electrically conductive material 110, thereby allowing an additional heat dissipation pathway.

For instance, in some embodiments, at least two of the support structures 115 are configured as leads that electrically connect the inductor assembly via the electrically conductive material 110 to a signal source (not shown) of the electrical circuit 200. For instance, a power circuit such as a dc-dc buck converter (not shown) that requires an inductor can utilize inductor assembly 100. Said assembly may be connected to at least two of the landing pads (e.g., pads 230 shown in FIG. 2), such that an electrical current passes through the electrical material 110 that is wound around the portion 120 of the first or second magnetic cores 105, 125. Furthermore, the said two support structures 115 which serve as electrical leads may also conduct heat from the circuit board 202 and adjacent components. Said leads may be wider than what is required for good electrical and mechanical connection to facilitate better heat transfer from the circuit board 202 to the electrically conductive material 110.

For instance, in some embodiments, where the electrically conductive material 110 has four support structures 115, two of the structures (e.g., the two structures 115 on one side 135 of the second magnetic core 125) are configured as leads for electrical connection, and the other two support structures (e.g., the two support structures 115 on the other side 137 of the second magnetic core 125) are configured for mechanical connections to the circuit board 202. The electrically conductive material 110 thus conducts both the current passing through it as part of functioning as the inductor assembly 100, and also conducts heat generated by the electrical components 220 and the circuit board 202 up through the landing pads 230, 310, and the support structures 115. This heat radiates out of the inductor assembly 100 thereby lowering the thermal profile of the module 100 and the surrounding parts of the circuit 200. Additionally, as discussed above, electrical components 220 located directly underneath the inductor assembly 100 can also radiate heat by convective heat transfer into the lowermost magnetic core (e.g., the first magnet core 105 in FIGS. 2-3) and then this heat can be transferred by radiated or conductive heat transfer from the magnetic core 105 (or cores 105, 125) into the electrically conductive material 110. In another embodiment the electrical conductive material 110 may have three support structures 115. Two of the structures (e.g., the two structures 115 on one side 135 of the second magnetic core 125) are configured as leads for electrical connection. The notch 116 shown in FIG.

3 may be eliminated thus forming one support structure 115 on side 137 which extends substantially the length of the electrical conductive material 110. The landing pad 310 may be extended as well to fit the expanded support structure. This embodiment may be utilized to provide enhanced thermal conductivity from the circuit board 202 up through the landing pad 310, and the support structure 115 on side 137.

Based on the present disclosure one skilled in the art would appreciate that that any number of support structures 115 could be included as part of the electrically conductive material 110 and configured to serve in one or more roles as electrical leads, mechanical supports, or thermal conduits.

Additionally, if desired, to facilitate heat transfer, additional thermal conductive pathways between the magnetic core 105 (or second cores 125 when present) and the circuit boards 202 or components 220 thereon could be formed though the use of various thermally conductive material familiar to those skilled in the art.

Another embodiment of the disclosure is a method of manufacturing an inductor assembly 100. FIG. 4 presents a flow diagram of an example embodiment of a method 400 of manufacturing an inductor assembly, such as any of the example assemblies 100, including power module embodiments of such assemblies, such as discussed above in the context of FIGS. 1-3.

With continuing reference to FIGS. 1-3, the method 400 comprises a step 405 of providing a magnetic core 105, and, a step 420 of forming the electrically conductive material 110 (including two or more separate windings 150, 155 in some cases) so that it will wind around at least a portion of the magnetic core 105 and has one or more support structures 115 that extend beyond the boundary of the magnetic core. In some cases, forming in step 420 can include stamping a layer of the electrically conductive material 110 (e.g., a heavy copper layer) to form an opening (e.g., opening 185, FIG. 1) that permits the portion 120 of the magnetic core 105 (or the portion 120 of the second core 125, when present) to fit within the opening 185, and thereby provide a winding around the portion 120. In some cases forming in step 420 can include bending a layer of the electrically conductive material 110 (e.g., a heavy copper layer after stamping to form the opening 185) into the shapes of the one or more support structures 115.

In step 407 the formed electrically conductive material 110 is placed around at least a portion of the magnetic core 105.

Some embodiments of the method 400 further include a step 410 of providing a second magnetic core 125 wherein the second magnetic core 125 opposes the first magnetic core 105 and the electrically conductive material 110 in between the first magnetic core 105 and the second magnetic core 125. Alternatively, in some cases, in step 412 a non-magnetic material can be provided, the non-magnetic material 125 opposing the first magnetic core 105 and the electrically conductive material 110 in between the magnetic core 105 and the non-magnetic material 125.

One of ordinary skill in the art would be familiar with the procedures to shape a magnetic materials such as ferrite, into a suitable shapes to be used as the magnetic cores 105, 125 for an inductor 100 (e.g., EE, ER, PQ, UU, Toroid, EP, EPC, HI, or EQ shapes).

In some cases, the electrically conductive material 110 is configured to wind around at least a portion 120 of the magnetic core 105 (and in some cases the second magnetic core 125).

Some embodiments of the method 400 further include a step 430 of coupling the first magnetic core 105 and the second magnetic core 125, and optionally, the electrically conductive material 110, together. In some cases, the magnetic cores 105 110 are coupled together with adhesive and the electrically conductive material 110 can be free. For instance, the electrically conductive material 110 need not be coupled to the cores 105, 125, but rather can be confined between the cores 105, 125. However in other cases the electrically conductive material 110 can be coupled to one of both of the cores 105, 125. In various embodiments, tape, epoxy or other types of glue, clips or other mechanical fasters, or other procedures well know to one skilled in the art can be employed to couple the core 105, 125 and, optionally, electrically conductive material 110 together.

Alternatively, in some embodiments, the method 400 further include a step 435 of coupling the magnetic core 105, the electrically conductive material 110 and the non-magnetic material 125 together. Analogous to step 430, in some cases, as part of step 435, the first magnetic core 105 and the non-magnetic material 125 are coupled together, and the electrically conductive material 110 can be free. Any of the procedures that couple the first and second magnetic cores 105, 125 and, optionally, the electrically conductive material 110, together in step 430 could also be used in step 435.

Although the embodiments have been described in detail, those of ordinary skill in the art should understand that they could make various changes, substitutions and alterations herein without departing from the scope of the disclosure.

What is claimed is:

1. An inductor assembly, comprising:

a magnetic core; and an electrically conductive material configured to wind around at least a portion of the magnetic core, wherein the electrical conductive material has one or more support structures that extend beyond an outside boundary of the magnetic core, and;

a second magnetic core opposing the magnetic core, wherein the electrically conductive material is located in between the magnetic core and the second magnetic core, wherein the electrically conductive material is configured to wind around at least a portion of the second magnetic core.

2. The assembly of claim 1, wherein the electrically conductive material is wound a plurality of times around the portion of the magnetic core.

3. The assembly of claim 1, wherein two of the support structures are separated from, and adjacent, to one side of the magnetic core and another two of the support structures are separated from and adjacent to an opposite side of the magnetic core.

4. The assembly of claim 1, wherein terminal ends of the one or more support structures are configured to contact a corresponding one or more landing pads located on a circuit board.

5. An inductor assembly, comprising:

a magnetic core; and an electrically conductive material configured to wind around at least a portion of the magnetic core, wherein the electrical conductive material has one or more support structures that extend beyond an outside boundary of the magnetic core, wherein the electrically conductive material has three or four of the support structures, each of the support structures extending equal distances beyond the an outside boundary of the magnetic core.

6. An inductor assembly, comprising:

a magnetic core; and an electrically conductive material configured to wind around at least a portion of the magnetic core, wherein the electrical conductive material has one or more support structures that extend beyond an outside boundary of the magnetic core, wherein the one or more support structures extend beyond the outside boundary of the magnetic core by a distance greater than a height of electrical components configured to be located on a circuit board and at least partly directly below the inductor assembly.

7. An inductor assembly, comprising:

a magnetic core; and an electrically conductive material configured to wind around at least a portion of the magnetic core, wherein the electrical conductive material has one or more support structures that extend beyond an outside boundary of the magnetic core, wherein the electrically conductive material includes two or more electrically conductive windings each separated by an insulating layer.

8. An electrical circuit, comprising:

a circuit board having electrical components thereon; and one or more inductor assemblies located on the circuit board and adjacent to at least one of the electrical components, each of the inductor assemblies including an inductor assembly having:

a magnetic core; and an electrically conductive material configured to wind around at least a portion of the magnetic core, wherein the electrical conductive material has one or more support structures that extend beyond an outside boundary of the magnetic core, wherein each of the inductor assemblies further includes a second magnetic core opposing the magnetic core, wherein the electrically conductive material is located in between the magnetic core and the second magnetic core, and wherein the electrically conductive material is configured to wind around at least a onion of the second magnetic core.

9. The circuit of claim 8, wherein terminal ends of the one or more support structures are configured to contact a corresponding one or more landing pads located on the circuit board.

10. The circuit of claim 9, wherein the terminal ends of the one or more support structures are solder bonded to the corresponding one or more landing pads.

11. The circuit of claim 8, further including:

at least two of the support structures are configured as leads that electrically connect the electrically conductive material to a power source of the electrical circuit.

12. An electrical circuit, comprising:

a circuit board having electrical components thereon; and one or more inductor assemblies located on the circuit board and adjacent to at least one of the electrical components, each of the inductor assemblies including an inductor assembly having:

a magnetic core; and an electrically conductive material configured to wind around at least a portion of the magnetic core, wherein the electrical conductive material has one or more support structures that extend beyond an outside boundary of the magnetic core, wherein the one or more support structures extend beyond the outside boundary of the magnetic core by a distance greater than a height of the electrical components located at least partly directly below inductor assembly.

13. An electrical circuit comprising:

a circuit board haying electrical components thereon; and one or more inductor assemblies located on the circuit board and adjacent to at least one of the electrical components, each of the inductor assemblies including an inductor assembly having;

a magnetic core; and an electrically conductive material configured to wind around at least a portion of the magnetic core, wherein the electrical conductive material has one or more support structures that extend beyond an outside boundary of the magnetic core, wherein terminal ends of the one or more support structures are configured to contact a corresponding one or more landing pads located on the circuit board, wherein at least one of landing pads are connected to heat generating electrical component on the circuit hoard.

14. A method of manufacturing an inductor assembly for an electrical circuit, comprising:

providing a magnetic core;

forming an electrically conductive material which winds around at least a portion of the magnetic core, wherein the electrical conductive material has one or more support structures that extend beyond an outside boundary of the magnetic core;

providing a second magnetic core, wherein the second magnetic core opposes the magnetic core and the electrically conductive material in between the magnetic core and the second magnetic core; and winding the electrically conductive material around at least a portion of the second magnetic core.

15. The method of claim 14, further including coupling the magnetic core and the second magnetic core together.

16. A method of manufacturing an inductor assembly for an electrical circuit, comprising:

providing a magnetic core;

forming an electrically conductive material which winds around at least a portion of the magnetic core, wherein the electrical conductive material has one or more support structures that extend beyond an outside boundary of the magnetic core;

providing a nonmagnetic material, wherein the non-magnetic material opposes the magnetic core and the electrically conductive material is located in between the magnetic core and the non-magnetic material.

17. The method of claim 16, further including coupling the magnetic core and the non-magnetic material together.

* * * * *

UNITED STATES PATENT AND TRADEMARK OFFICE

CERTIFICATE OF CORRECTION

PATENT NO. : 8,917,524 B2
APPLICATION NO. : 13/366598
DATED : December 23, 2014
INVENTOR(S) : Catalano It is certified that error appears in the above-identified patent and that said Letters Patent is hereby corrected as shown below:

In the Claims

In Column 9, Line 33, in Claim 8, delete "onion of" and insert -- portion of --, therefor.

In Column 10, Line 8, in Claim 13, delete "haying" and insert -- having --, therefor.

In Column 10, Line 23, in Claim 13, delete "hoard." and insert -- board. --, therefor.

Signed and Sealed this
Eleventh Day of August, 2015

Michelle K. Lee
*Director of the United States Patent and Trademark Office*